(12) United States Patent
Bush et al.

(10) Patent No.: US 11,296,244 B2
(45) Date of Patent: Apr. 5, 2022

(54) SOLAR CELL COMPRISING A METAL-OXIDE BUFFER LAYER AND METHOD OF FABRICATION

(71) Applicant: The Board of Trustees of the Leland Stanford Junior University, Palo Alto, CA (US)

(72) Inventors: Kevin Alexander Bush, Stanford, CA (US); Axel F Palmstrom, Santa Barbara, CA (US); Michael David McGehee, Palo Alto, CA (US); Stacey F Bent, Stanford, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 86 days.

(21) Appl. No.: 16/334,540

(22) PCT Filed: Sep. 15, 2017

(86) PCT No.: PCT/US2017/051753
§ 371 (c)(1),
(2) Date: Mar. 19, 2019

(87) PCT Pub. No.: WO2018/057419
PCT Pub. Date: Mar. 29, 2018

(65) Prior Publication Data
US 2019/0221690 A1 Jul. 18, 2019

Related U.S. Application Data

(60) Provisional application No. 62/397,293, filed on Sep. 20, 2016, provisional application No. 62/398,220, filed on Sep. 22, 2016.

(51) Int. Cl.
*H01L 31/0224* (2006.01)
*H01L 27/30* (2006.01)
(Continued)

(52) U.S. Cl.
CPC .... *H01L 31/022475* (2013.01); *H01L 27/302* (2013.01); *H01L 31/022483* (2013.01);
(Continued)

(58) Field of Classification Search
CPC ..... H01L 31/022475; H01L 31/022483; H01L 31/03923; H01L 31/03925; H01L 27/302
See application file for complete search history.

(56) References Cited

U.S. PATENT DOCUMENTS 7,148,417 B1 12/2006 Landis
9,391,287 B1 7/2016 Huang et al.
(Continued)

FOREIGN PATENT DOCUMENTS

AU 2013319979 A1 3/2015
WO 2014/045021 A1 3/2014
(Continued)

OTHER PUBLICATIONS

Sutto et al., Bandgap-tunable cesium lead halide perovskites with high thermal stability for efficient solar cells, Adv. Energy Mater. 2016, 6, 1502458 (Year: 2016).*
(Continued)

*Primary Examiner* — Shannon M Gardner
(74) *Attorney, Agent, or Firm* — Kaplan Breyer Schwarz, LLP

(57) ABSTRACT

A perovskite-based solar cell comprising a transparent electrode disposed on a buffer layer that protects the perovskite from damage during the deposition of the electrode is disclosed. The buffer material is deposited using either low-temperature atomic-layer deposition, chemical-vapor deposition, or pulsed chemical-vapor deposition. In some embodiments, the perovskite material is operative as an absorption layer in a multi-cell solar-cell structure. In some
(Continued)

embodiments, the perovskite material is operative as an absorption layer in a single junction solar cell structure.

11 Claims, 9 Drawing Sheets

(51) Int. Cl.
  *H01L 51/42* (2006.01)
  *H01L 51/44* (2006.01)
  *H01L 31/0392* (2006.01)
(52) U.S. Cl.
  CPC .. *H01L 31/03923* (2013.01); *H01L 31/03925* (2013.01); *H01L 51/4273* (2013.01); *H01L 51/442* (2013.01); *Y02E 10/549* (2013.01)

(56) References Cited

U.S. PATENT DOCUMENTS

| | | | |
|---|---|---|---|
| 9,564,593 | B2 | 2/2017 | Karunadasa et al. |
| 10,522,774 | B2 | 12/2019 | Bush et al. |
| 10,535,791 | B2 | 1/2020 | Mailoa et al. |
| 2002/0081786 | A1 | 6/2002 | Toet et al. |
| 2002/0117199 | A1 | 8/2002 | Oswald |
| 2010/0051098 | A1 | 3/2010 | Sheng et al. |
| 2011/0132423 | A1 | 6/2011 | Joge et al. |
| 2011/0139227 | A1 | 6/2011 | Sivananthan et al. |
| 2011/0146755 | A1 | 6/2011 | Curran et al. |
| 2011/0162697 | A1 | 7/2011 | Sivananthan et al. |
| 2011/0232758 | A1 | 9/2011 | Khanarian et al. |
| 2011/0272012 | A1 | 11/2011 | Heng et al. |
| 2012/0017976 | A1 | 1/2012 | Nechache et al. |
| 2014/0290727 | A1 | 10/2014 | Yamamoto et al. |
| 2015/0053259 | A1 | 2/2015 | Hardin et al. |
| 2015/0249170 | A1 | 9/2015 | Snaith et al. |
| 2015/0303343 | A1 | 10/2015 | Kleimam et al. |
| 2016/0035927 | A1 | 2/2016 | Gershon et al. |
| 2016/0087233 | A1 | 3/2016 | Guha et al. |
| 2016/0133672 | A1 | 5/2016 | Koposov et al. |
| 2016/0163904 | A1 | 6/2016 | Mailoa et al. |
| 2016/0190377 | A1 | 6/2016 | Green |
| 2016/0307704 | A1 | 10/2016 | Hillhouse et al. |
| 2016/0351808 | A1 | 12/2016 | Luchinger et al. |
| 2017/0155007 | A1 | 6/2017 | Terashita et al. |
| 2017/0194101 | A1 | 7/2017 | Karunadasa et al. |
| 2017/0358398 | A1 | 12/2017 | Beaumont et al. |
| 2018/0277696 | A1 | 9/2018 | Karunadasa et al. |
| 2018/0290897 | A1 | 10/2018 | Snaith et al. |
| 2018/0309077 | A1 | 10/2018 | Bush et al. |

FOREIGN PATENT DOCUMENTS

| | | |
|---|---|---|
| WO | 2015/017885 A1 | 2/2015 |
| WO | 2015/085441 A1 | 6/2015 |
| WO | 2017/037448 A1 | 3/2017 |

OTHER PUBLICATIONS

Yi Wei: "Synthesis and optical properties of self-assembled 2D layered orgnic-inorganic perovskites for optoelectronics". Thesis. ENS Cachan, Jul. 2012.
Todorov, et al.: "Perovskite-kesterite monolithic tandem solar cells with high open-circuit voltage." Applied Physics Letters, 105(17), 173902. (2014).
Tanaka et al: "Bandgap and exciton binding energies in lead-iodide-based natural quantum-well crystals". 2003. Science and technology or advanced materials, 4:6, 599-604.
Stoumpos, Constantinos C., et al.; Semiconductng Tin and Lead Iodide Perovskites with Organic Cations: Phase Transitions, High Mobilities, and Near-Infrared Photoluminescent Properties; Inorg. Chem. 2013, 52, 9019-9038 (Year: 2013).
Slavney, Adam H. et al.; A Bismuth-Halide Double Perovskite with Long Carrier Recombination Lifetime for Photovoltaic Applications; D. Am. Ohm. Soc., 2016, 138, 2138-2141 (Year: 2016).
Requirement for Restriction/Election received for U.S. Appl. No. 14/733,462, dated Sep. 25, 2015, 7 pages.
Requirement for Restriction/Election received for French Application No. 15/769,287, dated Dec. 6, 2018, 11 pages.
Rebecca J. Sutton et al.: "Bandgap-Tunable Cesium Lead Halide Perovskites with High Thermal Stability for Efficient Solar Cells", Advanced Energy Materials, vol. 6, No. 8, Feb. 2, 2016 (Feb. 2, 2016), p. 1502458.
Outgoing Written Opinion of the ISA dated Apr. 7, 2016 for WO Application No. PCT/US15/063817.
Non-Final Rejection received for U.S. Appl. No. 15/769,287, dated Apr. 4, 2019, 11 pages.
Non-Final Rejection received for U.S. Appl. No. 15/397,565, dated Mar. 8, 2019, 15 pages.
Non-Final Rejection received for U.S. Appl. No. 14/958,587, dated Mar. 22, 2019, 25 pages.
Loper, et al.: "Organic-inorganic halide perovskites: Perspectives for silicon-based tandem solar cells." IEEE Journal of Photovoltaics, 4(6), 1545-1551. (2014).
Liu, et al.: "Efficient planar heterojunction perovskite solar cells by vapour deposition." Nature, 501 (7467), 395-398. (2013).
Lee et al.: "Efficient hybrid solar cells based on meso-superstructured organometal halide perovskites". Science 338, 643-647 (2012).
Jeremie Werner et al: "Parasitic Absorption Reduction in Metal Oxide-Based Transparent Electrodes: Application in Perovskite Solar Cells", ACS Applied Materials & Interfaces, vol. 8, No. 27, Jun. 24, 2016 (Jun. 24, 2016), p. 17260-17267.
GB Application No. 1515546.8, priority document for WO 2017/037448 A1; filed Sep. 2, 2015 (Year: 2015).
Fan Fu et al.: "Low-temperature-processed efficient semi-transparent planar perovskite solar cells for bifacial and tandem applications", Nature Communications, vol. 6, Nov. 18, 2015 (Nov. 18, 2015), p. 8932.
"Non-Final Office Action", issue in related U.S. Appl. No. 14/733,462, dated Mar. 10, 2016, 14 pages.
"Final Office Action", issued in related U.S. Appl. No. 14/733,462, dated Oct. 28, 2016, 28 pages.
"Notice of Allowance" issued in related U.S. Appl. No. 14/733,462, dated Nov. 21, 2016, 10 pages.
Examiner initiated interview summary received for U.S. Appl. No. 14/733,462, dated Oct. 28, 2016, 1 pages.
Colin D. Bailie et al., "High-efficiency tandem perovskite solar cells", https://web.stanford.edu/group/mcgehee/publications/MRS2015.pdf, "MRS Bulletin", dated Aug. 1, 2015, vol. 40.
Bush Kevin A et al.: "Thermal and environmental stability of semi-transparent perovskite solar cells for tandems by a solution-processed nanoparticle buffer layer and sputtered ITO electrode", 2016 IEEE 43rd Photovoltaic Specialists Conference (PVSC), IEEE, Jun. 5, 2016 (Jun. 5, 2016), pp. 246-248.
Authorized Officer: Lee W. Young, "International Search Report and Written Opinion" issued in related PCT Application No. PCT/US2016/058156, dated Apr. 19, 2017.
Authorized Officer: Fratiloiu, Silvia, International Search Report and Written Opinion issued in PCT application No. PCT/US2017/051753, dated Nov. 29, 2017, 13 pp.
Authorized Officer: Lee W. Young, "International Search Report and Written Opinion" issued in related PCT App. No. PCT/US2015/063817 dated Mar. 22, 2016.
Advisory Action received for U.S. Appl. No. 15/397,565, dated Feb. 20, 2020, 3 pages.
European Supplementary Search Report and Search Opinion Received for EP Application No. 16864751.9, dated Jun. 12, 2019, 8 pages.
Examination Report issued in related India Patent Application No. 201827017353 dated Dec. 30, 2019.
Extended European Search Report issued in EP patent application No. 16864751.9, dated Jun. 12, 2019, 8 pp.
Final Office Action received for U.S. Appl. No. 15/397,565, dated Nov. 6, 2019, 12 pages.

(56) References Cited

OTHER PUBLICATIONS

Hoefler, Sebastian F., et al. "Progress on Lead-Free Metal Halide Perovskites for Photovoltaic Applications: a Review." Monatshefte Fur Chemie—Chemical Monthly, vol. 148, No. 5, Mar. 8, 2017, pp. 795-826., doi:10.1007/s00706-017-1933-9. (Year: 2017).
Non-Final Rejection dated Aug. 25, 2020 for U.S. Appl. No. 15/937,530.
Notice of Allowance received for U.S. Appl. No. 14/958,587, dated Oct. 9, 2019, 13 pages.
Notice of Allowance received for U.S. Appl. No. 15/769,287, dated Aug. 29, 2019, 9 pages.
Requirement for Restriction/Election dated Sep. 3, 2020 for U.S. Appl. No. 16/711,842.
Requirement for Restriction/Election received for U.S. Appl. No. 15/937,530, dated Mar. 3, 2020, 5 pages.
Communication from the Examining Division dated Mar. 22, 2021 for EP Application No. 16864751.9.
Communication issued in EP Patent Application No. 16864751.9 dated Mar. 22, 2021.
Examiner initiated interview summary (PTOL-413B) dated Nov. 5, 2020 for U.S. Appl. No. 16/711,842.
Office Action issued in counterpart Chinese patent application No. 201680069273.9, dated Jan. 27, 2021, 7 pp.
Final Rejection dated Apr. 21, 2021 for U.S. Appl. No. 15/937,530.
Li Xin et al, Thickness of ITO thin film influences on fabricating ZnO nanorods applying for dye-sensitized solarcell, Composites: Part B, Elsevier, Amsterdam , NL, pp. 147-152, vol. 74.
Mosconi, Edoardo, et al. "Electronic and Optical Properties of Mixed Sn—Pb OrganohalidE Perovskites: a First Principles Investigation." Journal of Materials Chemistry A, vol. 3, No. 17, 2015, pp. 9208-9215., doi:10.1039/c4ta06230b. (Year: 2015).
Non-Final Rejection dated Mar. 26, 2021 for U.S. Appl. No. 16/711,842.
Requirement for Restriction/Election dated Nov. 10, 2020 for U.S. Appl. No. 16/711,842.
Savory, Christophar N, et al. "Can Pb-Free Halide DoublEE PGrovskitas Support High-Efficiency Solar CgIIs?" ACS Energy LEttErs, vol. 1, Oct. 12, 2016, pp. 949-955. (Year: 2016).
Notice of Allowance dated Oct. 19, 2021 for U.S. Appl. No. 15/937,530.

\* cited by examiner

802

SOLAR CELL COMPRISING A METAL-OXIDE BUFFER LAYER AND METHOD OF FABRICATION

CROSS REFERENCE TO RELATED APPLICATIONS

This case claims priority of U.S. Provisional Patent Application Ser. No. 62/397,293, filed Sep. 20, 2016 and U.S. Provisional Patent Application Ser. No. 62/398,220, filed Sep. 22, 2016, each of which is incorporated herein by reference.

STATEMENT REGARDING FEDERALLY SPONSORED RESEARCH

This invention was made with Government support under contract DE-EE0006707 awarded by the Department of Energy. The Government has certain rights in the invention.

If there are any contradictions or inconsistencies in language between this application and one or more of the cases that have been incorporated by reference that might affect the interpretation of the claims in this case, the claims in this case should be interpreted to be consistent with the language in this case.

FIELD OF THE INVENTION

The present invention relates to solar cells in general, and, more particularly, to the formation of transparent electrodes for solar cells.

BACKGROUND OF THE INVENTION

A solar cell is an optoelectronic semiconductor device that converts the energy of incident light directly into electricity. The light is absorbed in an absorption layer of the solar-cell, which gives rise to the generation of free electrical carriers (i.e., electrons and holes). The free electrical carriers produce a voltage across the terminals of the device, which can be used to directly power electrical systems or be stored in an electrical storage system (e.g., a battery, etc.) for later use.

In order to generate a free-carrier pair in the absorption material, a photon must have energy greater than energy bandgap (EG) of the material. The EG of a material is the energy difference between the top of its valence band (the highest energy level populated by bound electrons) and the bottom of its conduction band (the lowest energy level populated by free electrons). When a photon is absorbed, its energy is given over to a bound electron-hole pair, which frees the electron and enables it to go from the valence band into the conduction band. The energy of a photon is inversely proportional to its wavelength ($E_p = hc/\lambda$, where $E_p$ is photon energy, h is Planck's constant, c is the speed of light, and $\lambda$ is wavelength); therefore, longer-wavelength light (e.g., red light) has lower photon energy than shorter-wavelength light (e.g., blue light). As a result, the choice of semiconductor used to absorb the light has significant impact on the efficiency of a solar cell.

Silicon is perhaps the most commonly used solar-cell material at present, due to its relatively low EG, highly developed fabrication infrastructure, and low cost as compared to other semiconductor materials. Unfortunately, silicon does not efficiently absorb light. In addition, since the free electrons and free holes tend to occupy energy levels at the bottom of the conduction band and the top of the valence band, respectively, any extra energy that the electron-hole pairs receive from higher-energy photons is lost as heat that is transferred into the semiconductor material in a process referred to as "thermalization." Thermalization loss both reduces the energy-conversion efficiency of the solar cell and raises the temperature of the device, which can lead to degradation and lifetime issues.

Both energy-conversion efficiency and thermalization loss can be improved by combining different materials in a "tandem solar cell" configuration. A tandem solar cell is a stacked structure comprising a top photovoltaic portion that is made of a material having a relatively higher EG and a bottom photovoltaic portion that is made of a material having a relatively lower EG. In other words, a tandem solar cell has two p-n junctions and two different band gaps. When light is incident on the solar cell, high-energy photons are first absorbed in the top portion, while lower-energy photons pass through the top portion to be absorbed in a bottom photovoltaic portion. This enables a broader spectrum of light to be absorbed, thereby improving energy-conversion efficiency beyond the single-junction efficiency limit. In addition, thermalization loss due to the absorption of high-energy photons in the bottom cell is reduced. Depending on the EG of the material of the top solar cell, the fundamental efficiency limit for silicon-based tandem solar cells can be as high as approximately 39%—significantly higher than the theoretical efficiency limit of 33.7% for a single-junction silicon solar cell.

Perovskites are among the most attractive materials for use in both single-junction and tandem-solar-cell structures. In recent years, single-junction perovskite-based solar cell efficiencies have become extremely competitive. Their rapid rise is the result of a unique combination of properties, such as strong optical absorption and long ambipolar diffusion lengths enabled by the benign nature of the intrinsic defects. In addition, perovskite-based solar cells have wide, tunable bandgaps and solution processability, which makes them particularly attractive for use as the top cell in tandem solar cell configurations having bottom cells comprising a lower-EG materials, such as silicon, copper indium gallium selenide (CIGS), etc. They present, therefore, a pathway to achieving industry goals of improving efficiency while continuing to drive down module cost.

Perovskite-based tandem solar cells have been demonstrated in both mechanically stacked, four-terminal configurations and monolithically integrated two and three-terminal configurations. Mechanically stacked tandem structures have seen the largest success, recently reaching a power conversion efficiency over 24%, as the architecture simplifies device fabrication, allows for silicon surface texturing, and requires no current matching. Monolithically integrated tandem structures, however, have greater promise due to the fact that they have fewer semitransparent electrode layers.

To date, however, the commercial viability of both single-junction and tandem perovskite-based solar cells has been limited due to thermal and environmental instability. In addition, the efficiency of monolithic perovskite-based tandem solar cells continues to lag behind their mechanically stacked counterparts, largely due to difficulties in depositing a transparent electrical contact on the perovskite-based top cell, where the transparent electrical contact is suitable as a highly transmissive window layer. Due to fabrication constraints, light must first pass through a hole-transport layer (e.g., Spiro-OMeTAD) in a standard architecture, or an electron-acceptor layer (e.g., [6,6]-phenyl-$C_{61}$-butyric acid methyl ester (PCBM)) in an inverted architecture, before entering the perovskite, which gives rise to significant parasitic losses. In addition, in order to deposit a highly transparent and conductive electrode (e.g., indium tin oxide (ITO), etc.), a buffer layer is required to protect the perovskite and organic carrier-extraction layers from damage due to the high energy of sputtered particles. Prior-art buffer layers, however, have poor long-term stability due to their chemical reactivity with perovskite compositions. Further, prior-art buffer layers have been plagued by low efficiency, which degrades fill factor and open-circuit voltage.

The need for a high-quality, highly transparent electrical contact suitable for use as a window layer in a solar cell and that is readily formed on a perovskite solar cell structure remains, as yet, unmet in the prior art.

SUMMARY OF THE INVENTION

The present invention enables high-conversion-efficiency perovskite-based solar cells that are environmentally stable and commercially viable. Embodiments of the present invention employ a buffer layer disposed on the surface of a perovskite-based absorption layer to protect it during the formation of an electrical contact on its surface, where the buffer layers are substantially non-reactive with perovskite materials, are energetically well aligned to act as a carrier extraction layer, and are thin enough to mitigate optical absorption. Embodiments of the present invention are particularly well suited for single-cell and multi-cell solar-cell structures (e.g., tandem solar cells, etc.).

An illustrative embodiment of the present invention is a single-junction solar cell disposed on a glass substrate, wherein the solar cell comprises a perovskite-based absorption layer (i.e., cell), a lower electrical contact of ITO, and a substantially transparent upper electric contact that functions as a window layer for the solar cell. The upper electrical contact includes an ITO layer sputter deposited on a buffer that comprises a bilayer of metal oxides. The metal oxide layers are deposited on the perovskite absorption layer via low-temperature atomic-layer deposition. In some embodiments, the buffer layer is deposited using pulsed-chemical vapor deposition.

In some embodiments, a perovskite layer is included as one of multiple absorption layers in a multi-cell solar-cell structure, such as a tandem solar cell. In some embodiments, a perovskite layer is included as the top absorption layer in a tandem solar cell having a bottom cell comprising silicon. In some embodiments, a perovskite layer is included as the top absorption layer in a tandem solar cell having a bottom cell comprising a material other than silicon, such as CIGS, a second perovskite that is characterized by a lower EG than the perovskite of the top cell, and the like.

In some embodiments, a solar-cell structure includes a buffer layer operative as a barrier layer that increases the environmental stability of the perovskite.

In some embodiments, a solar-cell structure includes a buffer layer having only one layer of metal oxide. In some of these embodiments, the buffer consists of tin oxide.

In some embodiments, a buffer layer is deposited using chemical-vapor deposition. In some embodiments, a buffer layer is deposited using pulsed chemical-vapor deposition.

In some embodiments, a buffer layer is provided such that it is substantially non-reactive with halides.

In some embodiments, a solar-cell structure includes a buffer layer that is operative as a carrier extraction layer in the solar cell.

An embodiment of the present invention is a solar cell (100) that is operative for converting a first light signal (124) into electrical energy, the solar cell including: a first absorption layer (110) comprising a first material (112), the first material being a perovskite and having a first energy bandgap; an electrical contact (122) that is in electrical communication with the first absorption layer, the electrical contact being substantially transparent for a first wavelength range, the first light signal including light within the first wavelength range; and a buffer layer (116) that is between the electrical contact and the first absorption layer, the buffer layer comprising a first layer (118) comprising a first metal oxide.

Another embodiment of the present invention is a method for forming a perovskite-based solar cell operative for converting a first light signal (124) into electrical energy, the method including: providing a first absorption layer (110) comprising a first perovskite (112), the first absorption layer being operative for absorbing at least a first portion (P1) of the first light signal; forming a buffer layer (116) that is disposed on the first absorption layer, the buffer layer including a first layer (118) comprising a first metal oxide, wherein the first layer is formed at a temperature that is less than or equal to 150° C.; and forming a first electrical contact (122) on the buffer layer, wherein the first electrical contact is substantially transparent for at least a portion of the first light signal.

DETAILED DESCRIPTION

Figure 1:
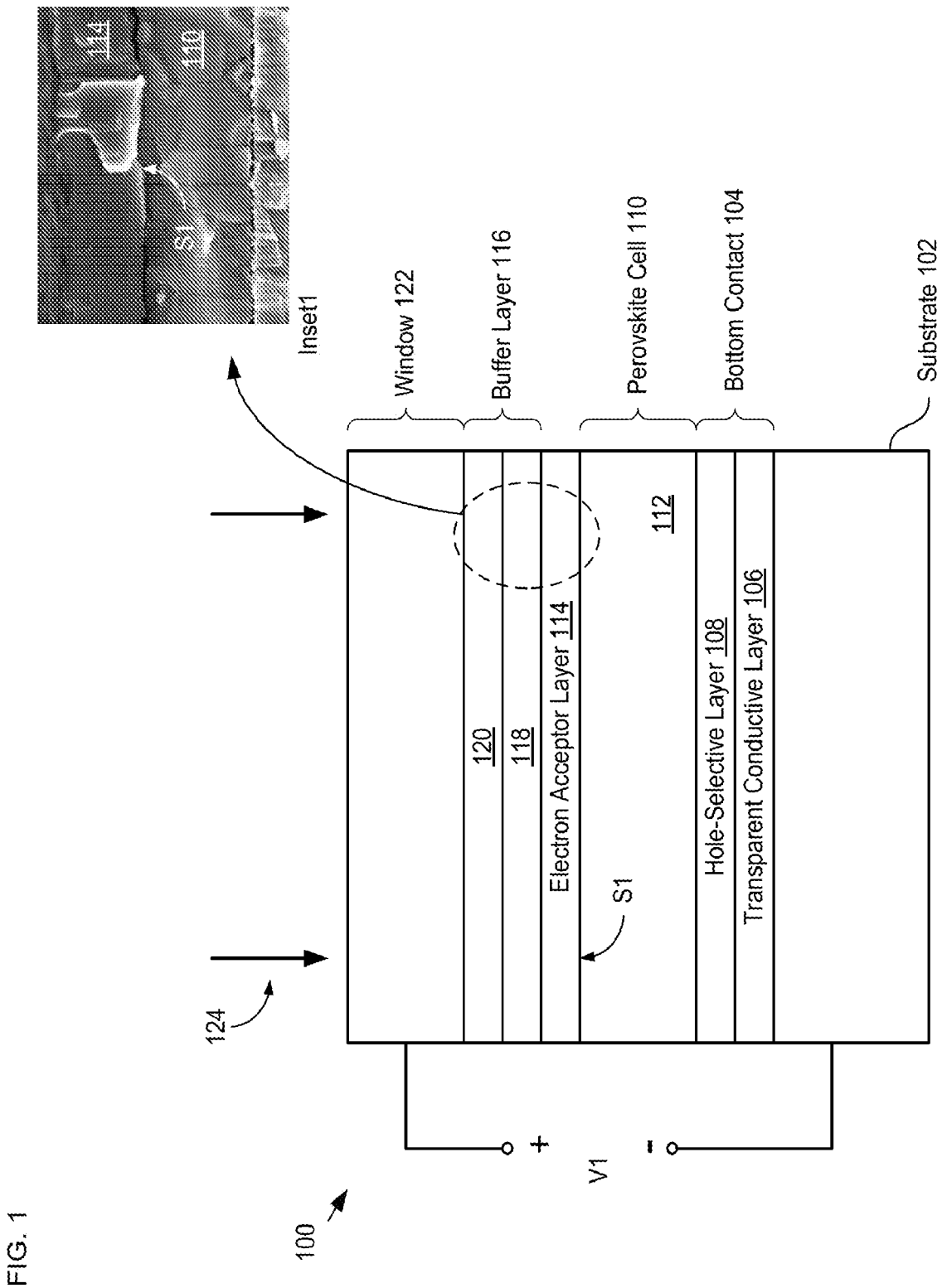
FIG. 1 depicts a schematic diagram of a cross-sectional view of a portion of a solar cell in accordance with an illustrative embodiment of the present invention.

FIG. 1 depicts a schematic diagram of a cross-sectional view of a portion of a solar cell in accordance with an illustrative embodiment of the present invention. Solar cell 100 comprises substrate 102, bottom contact 104, perovskite cell 110, electron-accepter layer 114, buffer layer 116, and contact 122. Solar cell 100 generates output voltage, V1, when illuminated with light signal 124 (i.e., solar radiation). Solar cell 100 is a perovskite-based single-junction solar cell that has an inverted architecture (i.e., the perovskite material is disposed on top of the p-type selective contact).

Figure 2:
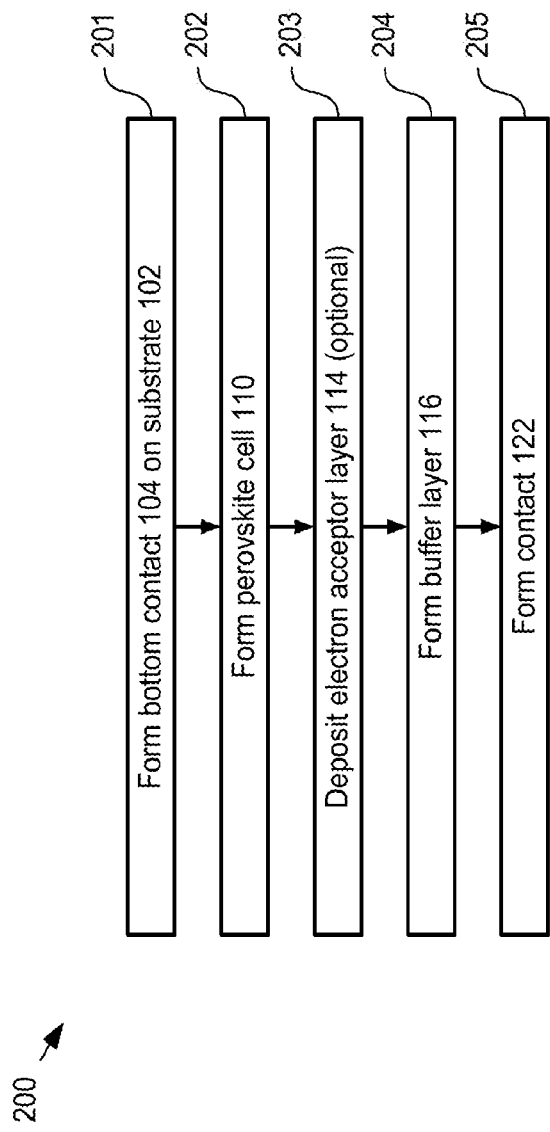
FIG. 2 depicts operations of a method suitable for forming a single-junction perovskite-based solar cell in accordance with the illustrative embodiment of the present invention.

FIG. 2 depicts operations of a method suitable for forming a single-junction perovskite-based solar cell in accordance with the illustrative embodiment of the present invention. Method 200 is described herein with continuing reference to FIG. 1. Method 200 begins with operation 201, wherein bottom contact 104 is formed on substrate 102.

Substrate 102 is a conventional glass substrate suitable for planar-processing operations. Preferably, substrate 102 comprises a material that is transparent for solar radiation, such as glass; however, other materials can be used for substrate 102 without departing from the scope of the present invention. Materials suitable for use in substrate 102 include, without limitation, polymers, glasses, semiconductors, ceramics, composite materials, and the like.

Bottom contact 104 is a two-layer structure that includes transparent conductive layer 106 and hole-selective contact layer 108.

Transparent conductive layer 106 is formed on substrate 102 in conventional fashion and includes an electrically conductive material that is substantially transparent for solar radiation. In the depicted example, transparent conductive layer 106 comprises ITO; however, in some embodiments, it includes a different transparent conductive material, such as zinc tin oxide (ZTO), indium zinc oxide (IZO), titanium nitride, tantalum nitride, electrically conductive nanoscale wires, and the like.

Hole-selective contact layer 108 (hereinafter referred to as layer 108) comprises nickel oxide (NiO). In some embodiments, hole-selective contact layer 108 includes a different hole-selective material, such as poly(3,4-ethylenedioxythiophene) polystyrene sulfonate (PEDOT:PSS21), poly[bis(4-phenyl)(2,4,6-trimethylphenyl)amine] (PTAA), and the like. In the depicted example, layer 108 is formed on transparent conductive layer 106 by spinning a 1M solution of nickel nitrate and ethylenediamine in ethylene glycol on layer 106 and annealing the material at 300° C.

At operation 202, perovskite cell 110 is formed on bottom contact 104. Perovskite cell 110 comprises material 112 and functions as the absorption layer of solar cell 100. Perovskite cell 110 is formed by dispensing a stoichiometric solution containing cesium iodide (CsI), formamidinium iodide (FAI), lead iodide ($PbI_2$), and lead bromide ($PbBr_2$) in a mixture of Dimethylformamide (DMF) and Dimethyl sulfoxide (DMSO) and spinning the substrate to yield a substantially uniform coating of ($Cs_{0.17}FA_{0.83}Pb(Br_{0.17}I_{0.83})_3$) perovskite. During spin coating, chlorobenzene is used as an antisolvent to assist perovskite crystallization. After it is formed, the coating is annealed on a hot plate at 50° C. for 1 minute and then at 100° C. for 30 minutes.

A perovskite cell containing ($Cs_{0.17}FA_{0.83}Pb(Br_{0.17}I_{0.83})_3$) perovskite is particularly desirable in embodiments of the present invention because it is more thermally stable than many other perovskites. Its use, therefore, affords embodiments of the present invention particular advantages. Furthermore, mixed-cation-perovskite solar cells have consistently outperformed their single-cation counterparts based on published literature. In fact, the first perovskite device to break 20% was fabricated with a mixture of methylammonium (MA) and formamidinium (FA). In addition, the inclusion of cesium enables high conversion efficiency with improved photo, moisture, and thermal stability. Improved moisture and thermal stability are particularly advantageous because they provide greater processing freedom when forming additional structures on top of the perovskite material. It should be noted, however, that myriad perovskites (e.g., pure methylammonium based perovskite ($MAPbI_3$), etc.) suitable for use in cell 110 exist and can be used without departing from the scope of the present invention.

At optional operation 203, electron-acceptor layer 114 is formed on perovskite cell 110. The formation of electron-acceptor layer 114 begins with the thermally evaporation of a layer of lithium fluoride (LiF) having a thickness of approximately 1 nm. The LiF layer acts as a passivation layer. This is followed by the thermal evaporation of a layer of PCBM having a thickness of approximately 10 nm. The thin layer of PCBM enables good electron-extraction properties, while still achieving high optical transmission. In some embodiments, PCBM also prevents the development of an extraction barrier. Although the illustrative embodiment includes an electron-acceptor layer comprising PCBM, it will be clear to one skilled in the art, after reading this Specification, how to specify, make, and use alternative embodiments that include an electron-acceptor layer comprising a different material, such as Cho-based triads, and the like.

At operation 204, buffer layer 116 is formed on electron acceptor-layer 114 such that the buffer layer is conformal with surface S1 of perovskite cell 110 (including electron-acceptor layer 114). Buffer layer 116 is formed such that it is substantially transparent for solar radiation, preferably has little or no parasitic absorption, and is capable of efficient electron extraction.

It is an aspect of the present invention that forming a thin conformal buffer layer using a deposition technique that does not damage sensitive layers beneath it affords significant advantages over the prior art. Specifically, a thin conformal layer avoids the need for thick planarizing layers used in prior-art solar cell structures, which are typically necessary in the prior art to prevent shunt pathways but which can inhibit transmission of solar radiation. Although other deposition methods can be used without departing from the scope of the present invention, preferably buffer layer 116 is deposited using one of atomic-layer deposition (ALD), chemical-vapor deposition (CVD), and pulsed CVD (p-CVD).

Inset1 of FIG. 1 is a scanning-electron microscope (SEM) image that shows the conformal nature of an ALD-deposited buffer layer on the surface of a perovskite cell in accordance with the present invention.

In the depicted example, buffer layer 116 is a bilayer comprising layers 118 and 120, which comprise tin oxide ($SnO_2$) and zinc tin oxide (ZTO), respectively.

Layer 118 is a layer of tin oxide having a thickness of approximately 4 nm. It is formed via ALD deposition using tetrakis(dimethylamino)tin(IV) (TDMASn) and water at approximately 30° C. In some embodiments, layer 118 is formed via ALD deposition using a different precursor and/or at a different temperature; however, it is preferable that the deposition be done at temperatures at or below 150° C. Low-temperature deposition is desirable because, although tin-oxide films have been shown to operate as effective electron-selective contacts, high deposition temperatures are known to degrade the stoichiometry and electronic properties of perovskite films.

An exemplary process for depositing layer 118 includes a 1.5-second long pulse of Tetrakis(dimethylamino)tin(IV) (TDMA-Sn) precursor, followed by a 30 second purge, a 1-second long deionized water pulse, and a second 30-second long purge, which yields a growth rate of 1.2 Å/cycle. During the deposition process, the door and body temperature of the ALD reactor (an Arradiance GEMStar-6 ALD system) are maintained at 100° C., while the manifold temperature is maintained at 115° C. The temperature of the precursor is held at 60° C. and each purge is conducted with a 90 sccm nitrogen flow rate.

After deposition of the tin-oxide layer, buffer layer 116 is completed with the formation layer 120, which is a layer of ZTO having a thickness of approximately 2 nm. Layer 120 is included in buffer layer 116 to facilitate good electrical connection with contact 122. However, as discussed below, the inclusion of layer 120 in buffer 116 is optional.

In the depicted example, layer 120 is formed using a combination of alternating tin-oxide depositions zinc oxide depositions, where the two processes are repeated in a "supercycle" comprising three cycles of tin-oxide deposition and three cycles of zinc-oxide deposition.

An exemplary process for depositing layer 120 includes a 100-millisecond long pulse of diethyl zinc (DEZ) precursor and water, followed by a 30 second purge, a 1-second long deionized water pulse, and a second 30-second long purge. This process gives rise to a growth rate of 1.8 Å/cycle. As in the deposition process described for layer 118 above, during the zinc-oxide deposition process, the door and body temperature of the ALD reactor (an Arradiance GEMStar-6 ALD system) are maintained at 100° C., while the manifold temperature is maintained at 115° C. and each purge is conducted with a 90 sccm nitrogen flow rate; however, during the deposition layer 120, the DEZ precursor is unheated. This exemplary process yields an effective growth rate of approximately 5.8 Å/supercycle.

It should be noted that tin oxide, by itself, is a good electron extractor, is compatible with perovskite materials, and can survive a wide range of deposition techniques, such as sputtering, CVD, evaporation, physical vapor deposition, spin coating, etc., that might be desirable for subsequent processing operations in the fabrication of solar cell 100 (e.g., the formation of contact 122). As a result, the inclusion of a ZTO layer in buffer layer 116 is optional. In some embodiments, therefore, buffer layer 116 is a single-layer structure that includes only tin oxide.

It should also be noted that tin oxide and zinc tin oxide are only two examples of materials suitable for use in buffer layer 116. In some embodiments, therefore, buffer layer 116 is a single-layer or multi-layer structure that includes one or more layers of another electron- or hole-transport material. Alternative materials suitable for use as buffer layer materials in embodiments of the present invention include, without limitation, titanium dioxide, nickel oxide, platinum oxide, vanadium oxide, tungsten oxide, molybdenum oxide and the like.

As noted above, each of layers 118 and 120 is deposited using ALD. ALD is preferred for depositing the buffer layer materials because it is a vapor-phase deposition technique capable of depositing conformal thin films through sequential self-limiting surface reactions. The use of ALD for the deposition of buffer layer materials affords some embodiments of the present invention with particular advantage over other prior-art deposition methods because ALD enables the fabrication of uniform, conformal, thin films having high optical transmission, regardless of the texture of the surface on which it is deposited. A wide range of metals and metal oxides can be deposited by ALD for photovoltaic applications. As a result, embodiments of the present invention mitigate problems associated with the typical high surface roughness of many perovskite materials, such as cesium formamidinium (CsFA) perovskites. In addition, many prior-art deposition methods, such as spin coating, require very thick layers to be formed to planarize the surface and prevent shunt pathways, which would lead to poor transmission. In addition, ALD is a soft-deposition method that typically does not damage organic extraction layers and forms compact metal-oxide layers that act as effective buffer layers during the subsequent sputter deposition of ITO to form a top electrical contact for the solar cell (i.e., contact 122).

Although ALD is the preferred method for depositing the materials of buffer layer 116, in some alternative embodiments, at least one layer of buffer layer 116 is formed using CVD or p-CVD.

CVD is a deposition process wherein one or more gaseous or plasma precursors flow and react or decompose on or near a surface in a continuous fashion. Surface reaction or decomposition is preferred to prevent nucleation above the surface, which would degrade the quality of the resultant layer and is often achieved through thermal degradation of precursor through high substrate temperatures. In embodiments of the present invention, CVD-deposition is performed using highly reactive precursors that decompose at low temperature to avoid degradation of the perovskite material. In addition, low-temperature CVD deposition provides more conformal films, which enables buffer layer 116 to be thin yet outperform prior-art layers, such as spun metal-oxide nanoparticles or organic materials. In addition, it enables deposition of materials that cannot be easily evaporated.

p-CVD is a modified ALD process having a continual, rather than purely step-wise, growth component. By separating the precursor pulses in the p-CVD regime, the benefits of surface growth and high uniformity provided by ALD are achieved; however, growth rates can be higher due to lingering precursor that gives rise to a CVD growth mode, which mitigates perovskite degradation and enables faster processing. The total process time required for forming ALD buffer layer 116 is reduced by reducing purge times from 30 sec to 5 sec, thereby leaving the "true ALD" regime and entering the pulsed-CVD growth regime. Using p-CVD, a growth rate of 0.5 nm/min can be achieved, resulting in a total contact deposition time of approximately 15 min. It should be noted that the stoichiometry and performance of the deposited $SnO_2$ and ZTO layers through ALD and pulsed-CVD are substantially identical. This is particularly important for some embodiments of the present invention since CVD is a well-known commercially viable and scalable process, and is already used in typical silicon solar-cell fabrication—for example, to deposit $SiN_x$ anti-reflection coatings for diffused-junction cells or amorphous silicon passivation layers for silicon heterojunction solar cells.

At operation 205, contact 122 is formed on buffer layer 116 to provide a top electrical contact that is substantially transparent for the radiation of light signal 124 (i.e., the "window layer" of solar cell 100). Contact 122 is formed via sputter deposition of an ITO layer having a thickness of approximately 400 nm. In some embodiments, contact 122 includes metal (e.g. silver, etc.) features, such as, traces, fingers, etc. and/or an antireflective coating (e.g. LiF, etc.). It is another aspect of the present invention that the presence of the robust buffer layer 116 on the top of the perovskite cell structure enables the sputter deposition of the ITO as a transparent electrode with little or no damage to the underlying PCBM layer (i.e., electron-acceptor layer 114) or perovskite cell 110.

Although sputter deposition of ITO is preferred for forming contact 122, in some embodiments, a different transparent conductive material is used in contact 122. Furthermore, the inclusion of buffer layer 116 enables the use of other deposition methods for forming contact 122 without departing from the scope of the present invention. Materials suitable for use in contact 122 include, without limitation, transparent conductive oxides (e.g., indium tin oxide, zinc tin oxide, indium zinc oxide, etc.), diffusion barriers (e.g., titanium nitride, tantalum nitride, etc.), metals (e.g., silver, gold, etc.), metal nanowires, and the like. Deposition processes suitable for use in depositing the material of contact 122 include, without limitation, sputter deposition, thermal evaporation, e-beam evaporation, chemical vapor deposition, physical vapor deposition, spin coating, and the like.

It should be noted that the materials and layer thicknesses provided herein are merely exemplary and that alternative materials and/or layer thicknesses can be used without departing from the scope of the present invention.

Figure 3:
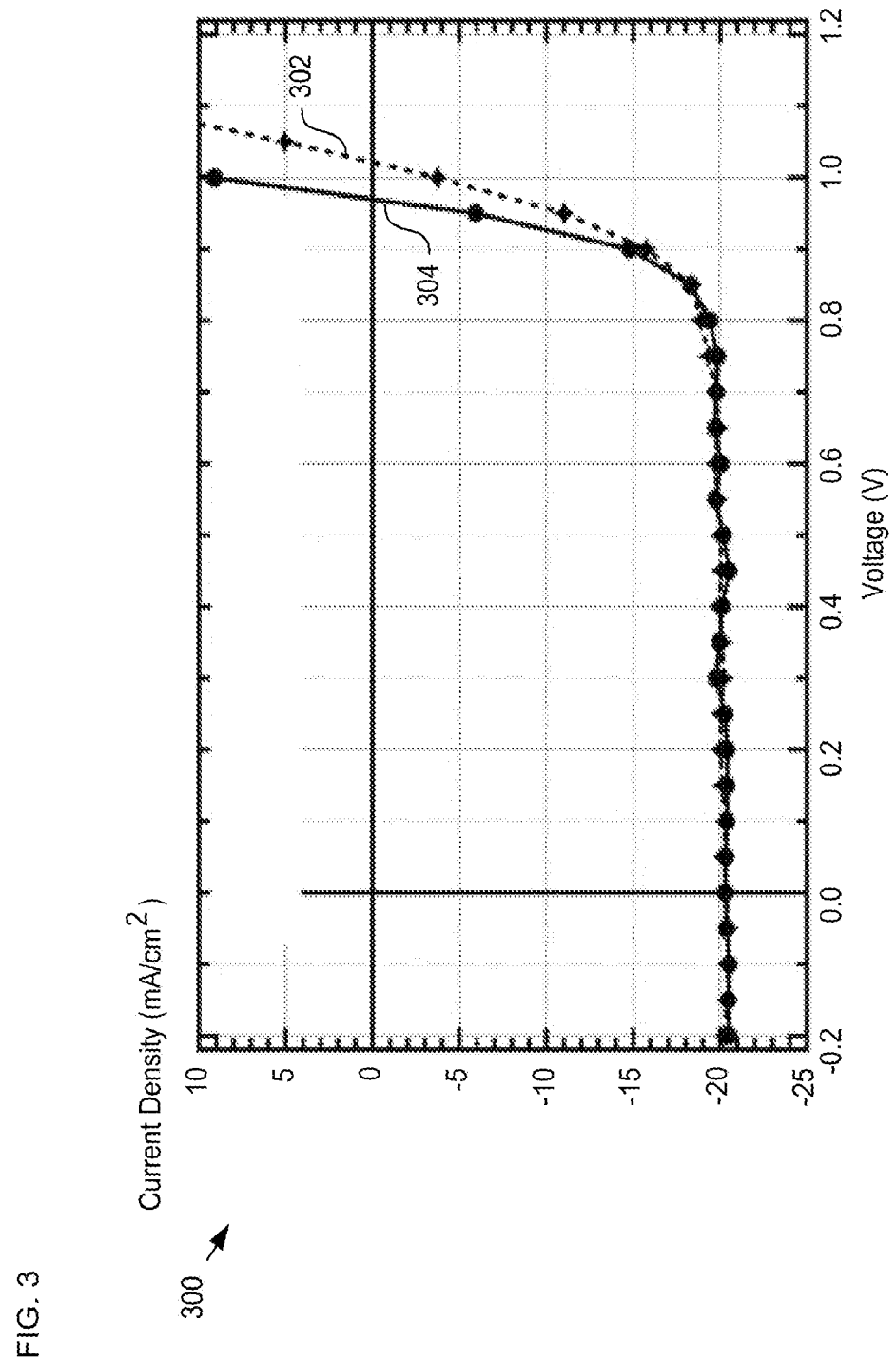
FIG. 3 depicts measurement data for solar cells having different electrodes.

FIG. 3 depicts measurement data for solar cells having different electrodes. Plot 300 includes traces 302 and 304, where trace 302 is the J-V curve of a semi-transparent device in accordance with the present invention and trace 304 is the J-V curve for a comparable device structure having an opaque top electrical contact comprising aluminum. Each device includes a buffer layer comprising ALD-deposited $SnO_2$ and ZTO layers. A careful comparison of traces 302 and 304 reveals that the inclusion of buffer layer 116 in the solar cell structure makes it possible to sputter deposit an ITO-based contact 122 that is substantially transparent while also remaining highly effective as an electrical contact.

Figure 4:
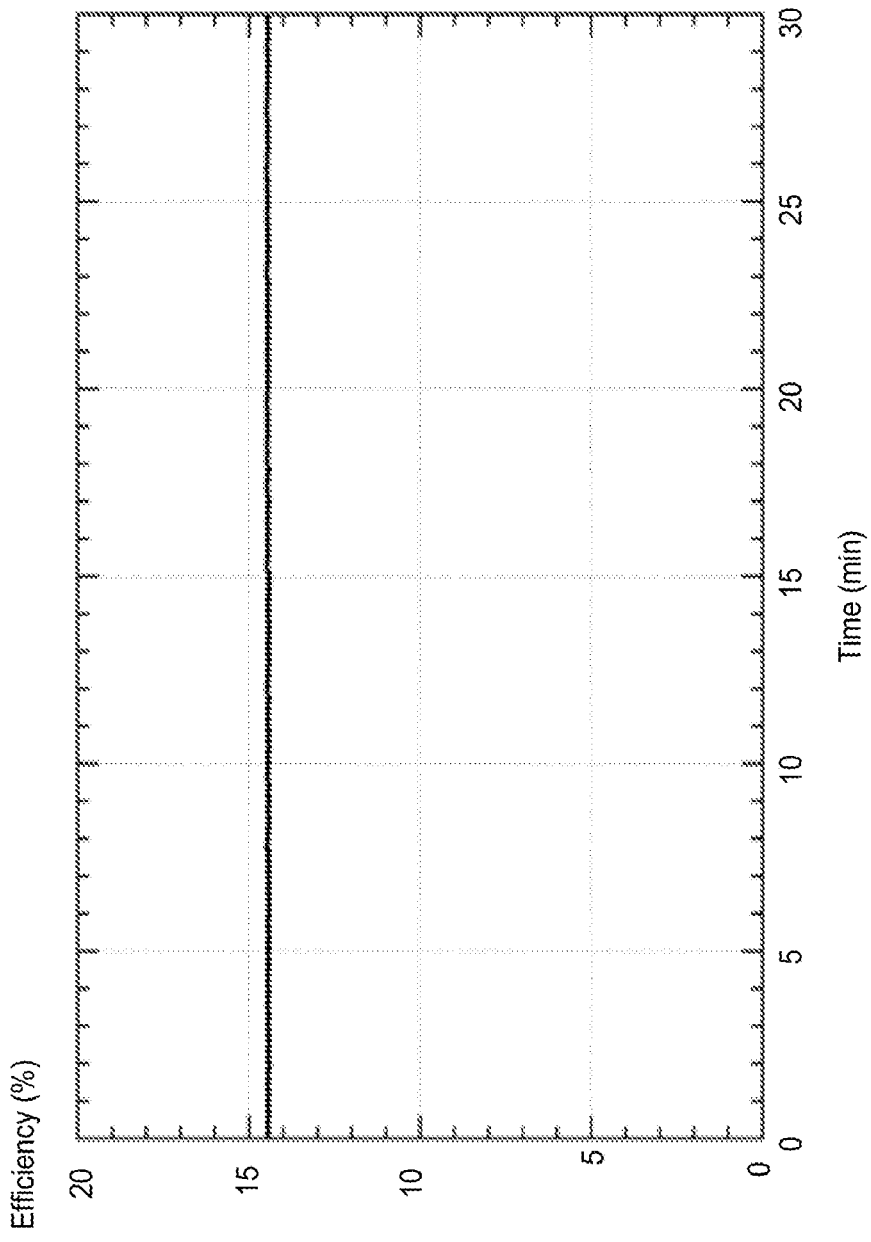
FIG. 4 depicts a plot of the maximum power output for a single-junction solar cell in accordance with the present invention.
Figure 5:
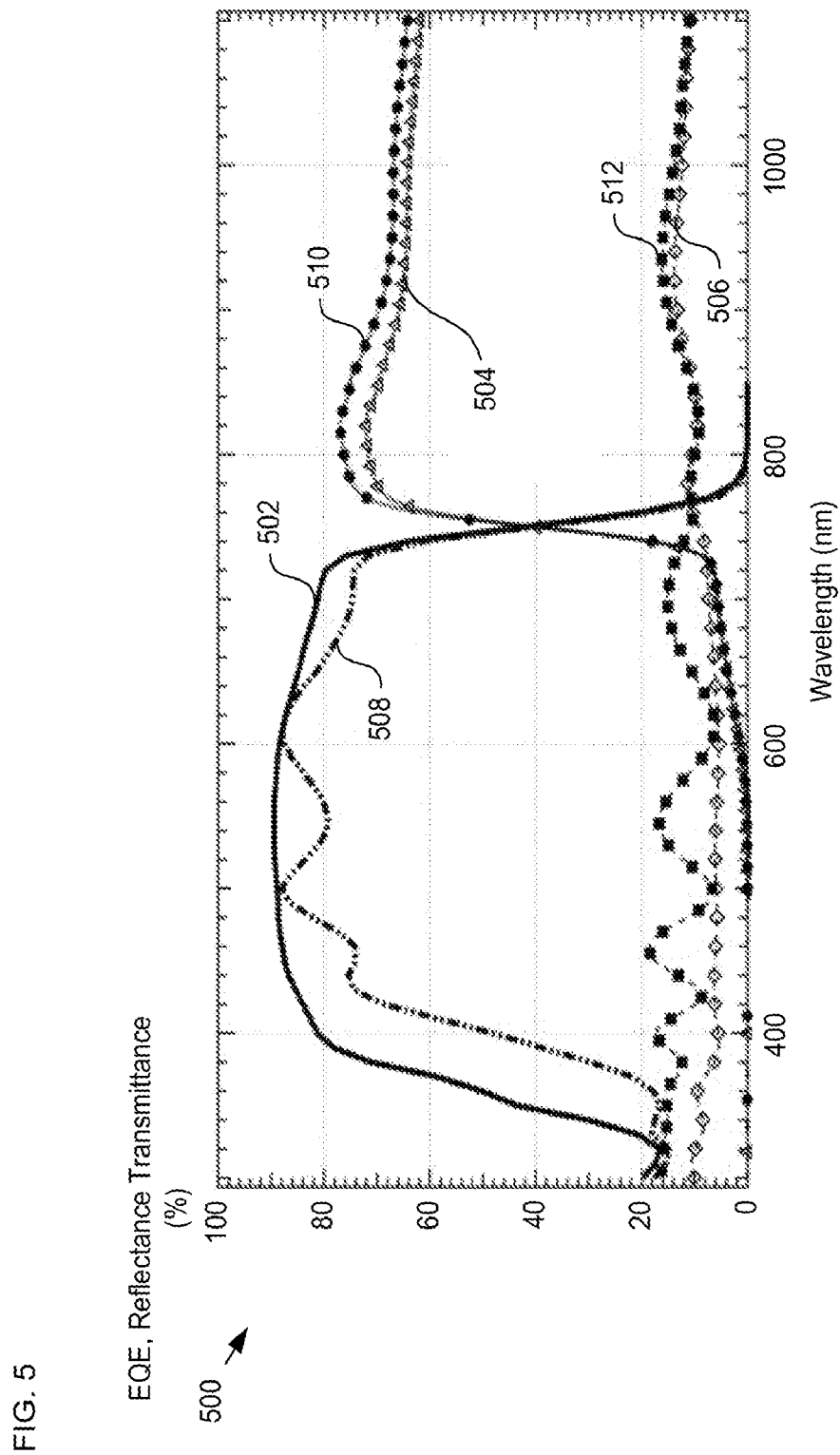
FIG. 5 depicts measurement data of external quantum efficiency (EQE), transmission, and reflection for a single-junction solar cell in accordance with the present invention.

FIG. 4 depicts a plot of the maximum power output for a single-junction solar cell in accordance with the present invention. Plot 400 shows a stable power output at 14.5% for a semi-transparent perovskite device in accordance with the present invention FIG. 5 depicts measurement data of external quantum efficiency (EQE), transmission, and reflection for a single-junction solar cell in accordance with the present invention. Plot 500 shows the external quantum efficiency (EQE), transmission, and reflection through substrate 102 (traces 502, 504, and 506, respectively) and through contact 122 (traces 508, 510, and 512, respectively). Plot 500 evinces the enhanced optical properties of the ALD $SnO_2$, since the EQE is substantially equal through either side of the device, while the transmission at longer wavelengths remains high and averages around 70% through contact 122.

Figure 6:
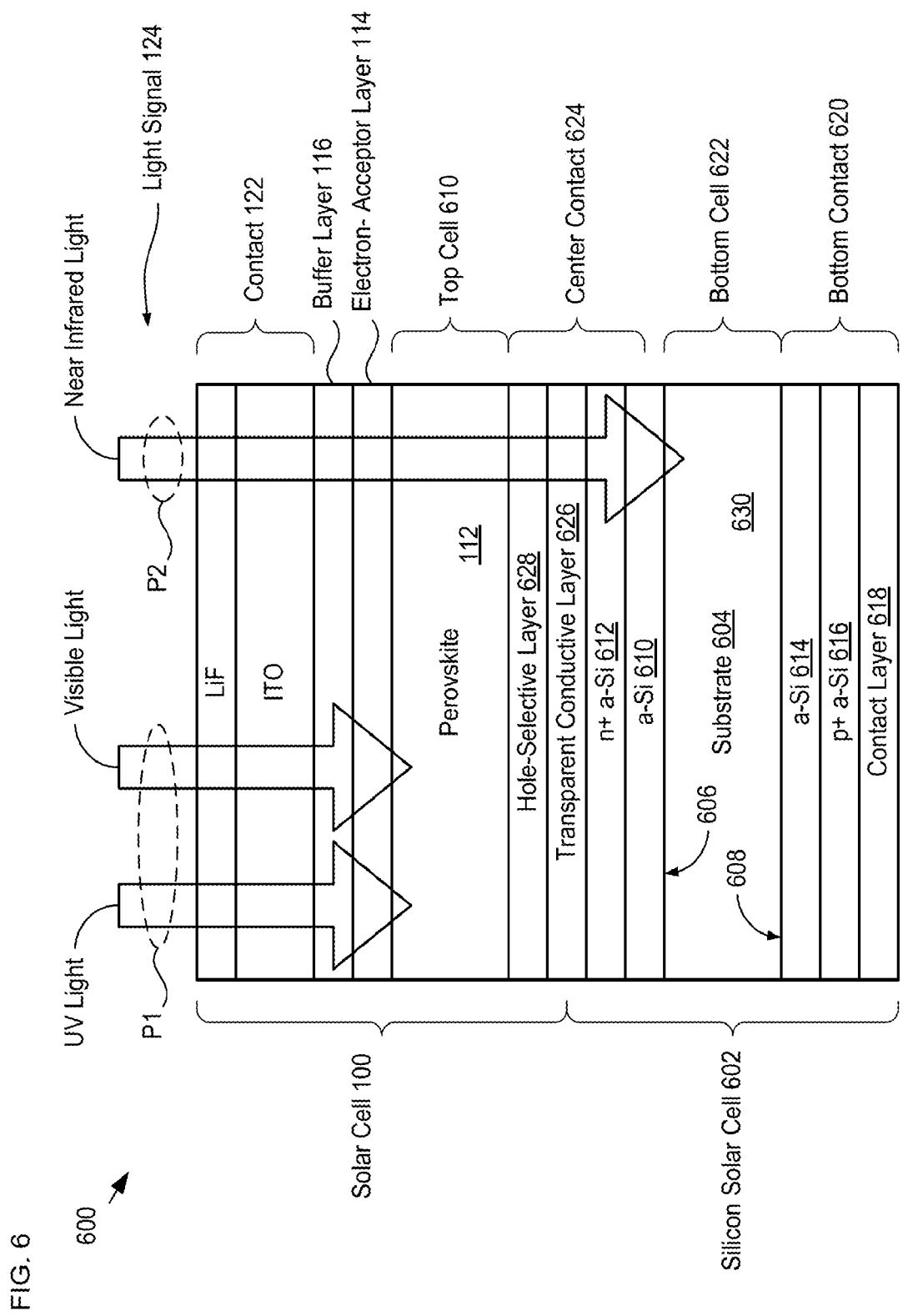
FIG. 6 depicts a schematic drawing of a cross-sectional view of a tandem solar cell in accordance with the present invention.

FIG. 6 depicts a schematic drawing of a cross-sectional view of a tandem solar cell in accordance with the present invention. Solar cell 602 is a silicon heterojunction solar cell, which has a high open-circuit voltage resulting from the separation of highly recombination-active (ohmic) contacts from the silicon absorber bulk.

Solar cell 600 includes solar cell 100 and solar cell 602, which are monolithically integrated on substrate 604.

Solar cell 100 and solar cell 602 are arranged such that light signal 124 is first incident the absorption layer of solar cell 100, which absorbs portion P1 of the solar radiation while second portion P2 passes through it to the absorption layer of solar cell 602. Portion P1 includes light having bandgap equal to or greater than the energy bandgap of the absorption layer of solar cell 100, while portion P2 includes light having energy less than the energy bandgap of the absorption layer of solar cell 602 (and, typically, some unabsorbed light of portion P1).

Solar cell 100 and solar cell 602 are monolithically integrated on substrate 604 to form a monolithically integrated tandem solar cell structure. For the purposes of this Specification, including the appended claims, the term "monolithically integrated" is defined as formed by depositing layers on a substrate via one or more thin-film deposition processes and, optionally, patterning the deposited layers after deposition. The term monolithically integrated explicitly excludes structures wherein two or more fully fabricated devices are joined, after their fabrication, to form a unitary structure.

Figure 7:
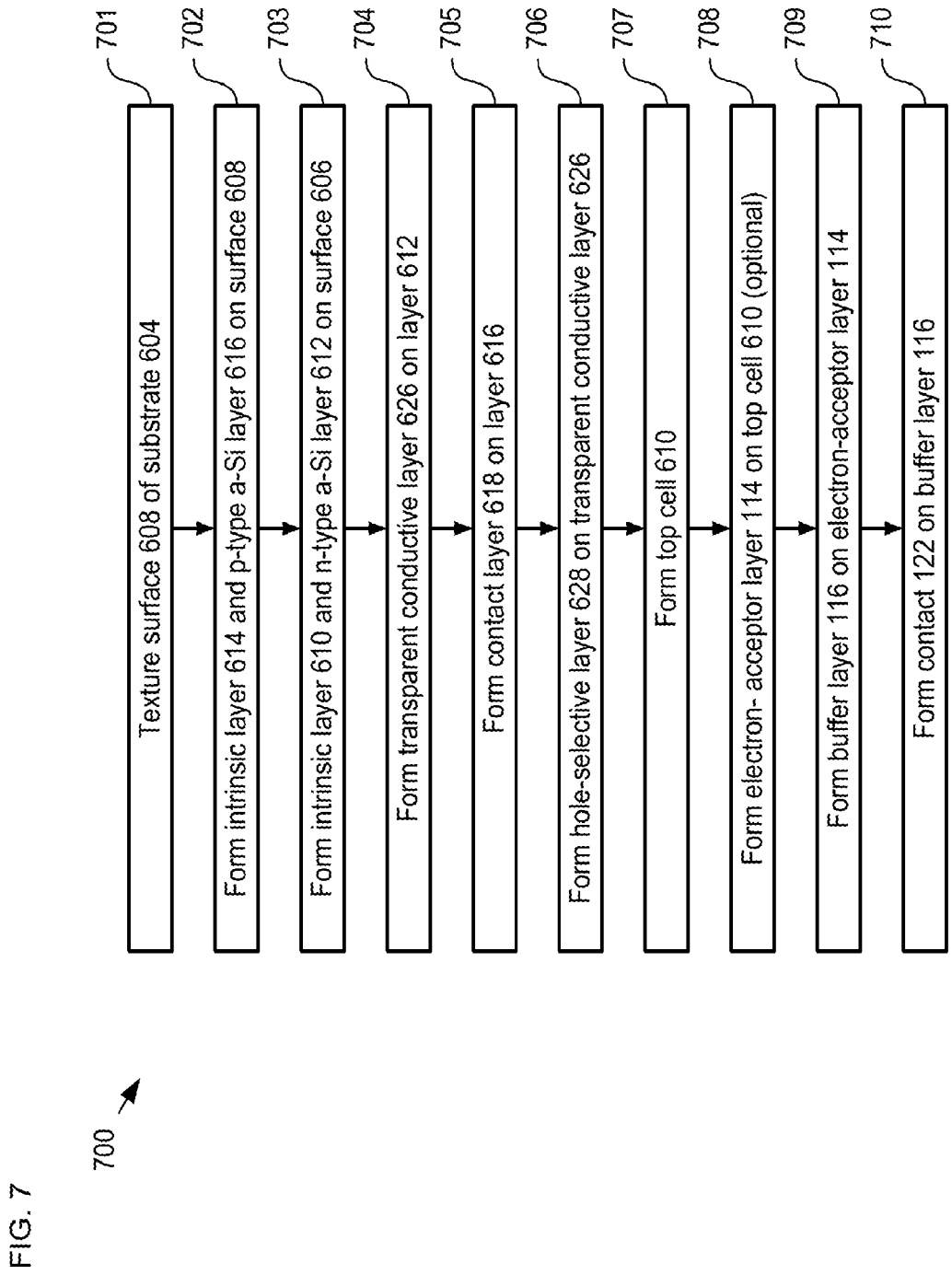
FIG. 7 depicts operations of a method suitable for forming a multi-junction solar cell in accordance with the present invention.

FIG. 7 depicts operations of a method suitable for forming a multi-junction solar cell in accordance with the present invention. Method 700 is described herein with continuing reference to FIG. 6. Method 700 begins with operation 701, wherein surface 608 of substrate 604 is textured.

Substrate 604 is a conventional substrate that is suitable for use in a planar processing fabrication sequence. In the depicted example, substrate 604 comprises material 630 and functions as the bottom cell (i.e., bottom absorption layer) in tandem solar cell 600. In the depicted example, substrate 604 is an n-type, 280-µm-thick, double-side polished float-zone (FZ) silicon wafer (i.e., material 630 is single-crystal silicon); however, other substrates can be used without departing from the scope of the present invention.

Surface 608 is textured by first depositing a 260-nm-thick, low-refractive-index silicon nitride layer by plasma-enhanced chemical-vapor deposition (PECVD) on surface 606. The substrate is then immersed in a potassium hydroxide (KOH) solution, which creates the desired texture on uncoated surface 608, while surface 606 is protected by its silicon nitride coating.

After removing the substrate from the KOH solution, the nitride coating is then removed from surface 606 using diluted hydrofluoric acid (HF), and the wafer is cleaned by immersion in a conventional piranha etch followed by a standard RCA-B cleaning sequence.

At operation 702, intrinsic and p-type amorphous silicon (a-Si:H) films 614 and 616 are formed on surface 608. These layers are included to provide surface passivation and facilitate electrical contact between contact layer 618 and bottom cell 622. In the depicted example, films 614 and 616 are formed with thicknesses of 7 and 15 nm, respectively. Typically, native oxide is removed from the deposition surface using buffered oxide etch (BOE) prior to the formation of these layers.

At operation 703, intrinsic and n-type a-Si:H films 610 and 612 are formed on surface 606 to provide surface passivation and facilitate electrical contact between the transparent conductive layer 626 and bottom cell 622. In the depicted example, films 610 and 612 are formed with thicknesses of 7 and 8 nm, respectively.

At operation 704, transparent conductive layer 626 is formed on layer 612 to complete center contact 624. In the depicted example, transparent conductive layer 626 is a layer of ITO having a thickness of approximately 20 nm; however, other materials and thicknesses can be used for transparent conductive layer 626 without departing from the scope of the present invention.

At operation 705, contact layer 618 is formed on a-Si layer 616, which completes bottom contact 620. In the depicted example, contact layer 618 comprises a layer of ITO having a thickness of 20 nm; however, other materials and thicknesses can be used for contact layer 618 without departing from the scope of the present invention.

In some embodiments, contact layer 618 includes a layer of silicon nanoparticles a thin layer of silver, where the layer of silicon nanoparticles includes a plurality of openings that enable ohmic contact between the silver and ITO layers, thereby facilitating charge collection at bottom contact 620. The addition of a silicon nanoparticle layer in contact layer 618 enhances the reflection of lower-energy photons not absorbed by substrate 604.

Once the bottom cell of tandem solar cell 600 (i.e., silicon solar cell 602) is complete, fabrication of the rest of the tandem solar-cell structure substantially follows the operations of method 200, as described above, with slight deviations to avoid degradation of the materials included in the bottom cell.

At operation 706, hole-selective layer 628 is formed on transparent-conductive layer 626 in analogous fashion to the formation of hole-selective layer 108 described above and with respect to method 200. However, it should be noted that, in operation 706, hole-selective contact layer 628 is annealed at a lower temperature than used to anneal hole-selective contact layer 108 to mitigate damage to previously formed layers in the solar cell structure. In the depicted example, hole-selective contact layer 628 is annealed at only 200° C. rather than at 300° C. as described above in method 200. One skilled in the art will recognize, after reading this Specification, that a lower-temperature anneal must typically have a longer duration; therefore, the annealing step of operation 706 is normally conducted for 10 hours or more. In some embodiments, hole-selective layer 628 is annealed at a different temperature and/or for a different amount of time.

At operation 707, top cell 610 is formed on hole-selective layer 628. Top cell 610 is analogous to perovskite cell 110 described above.

At operation 708, electron-acceptor layer 114 is optionally formed on top cell 610.

At operation 709, buffer layer 116 is formed on electron-acceptor layer 114.

At operation 710, contact 122 is formed on buffer layer 116 to complete the formation of tandem solar cell 600.

Although solar cell 600 is a tandem solar cell, it will be clear to one skilled in the art, after reading this Specification, how to specify, make, and use alternative embodiments that are multi-cell solar cells having any practical number of junctions.

Figure 8A:
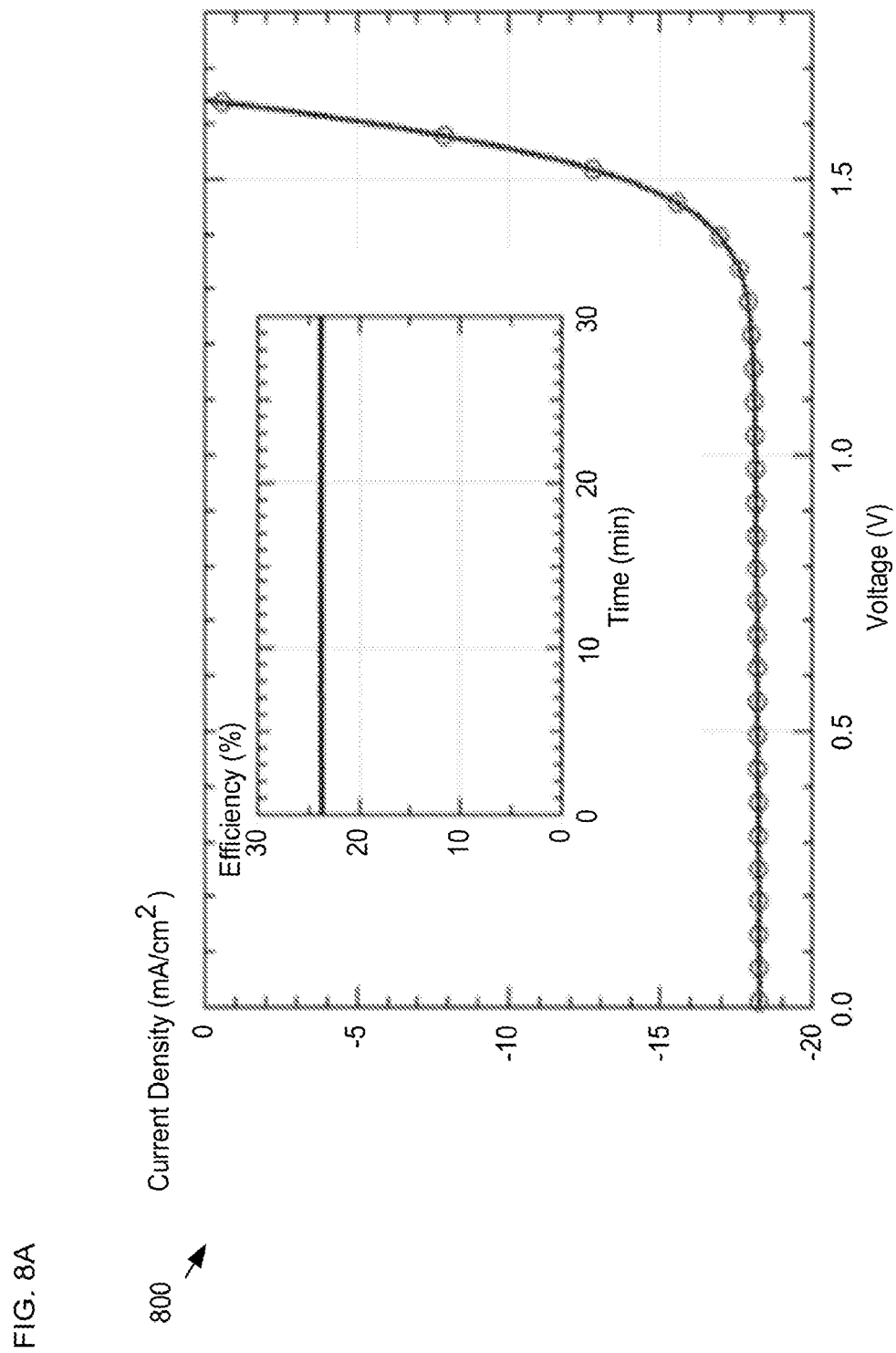
FIGS. 8A-B depict measured performance data for a tandem solar cell in accordance with the present invention.
Figure 8B:
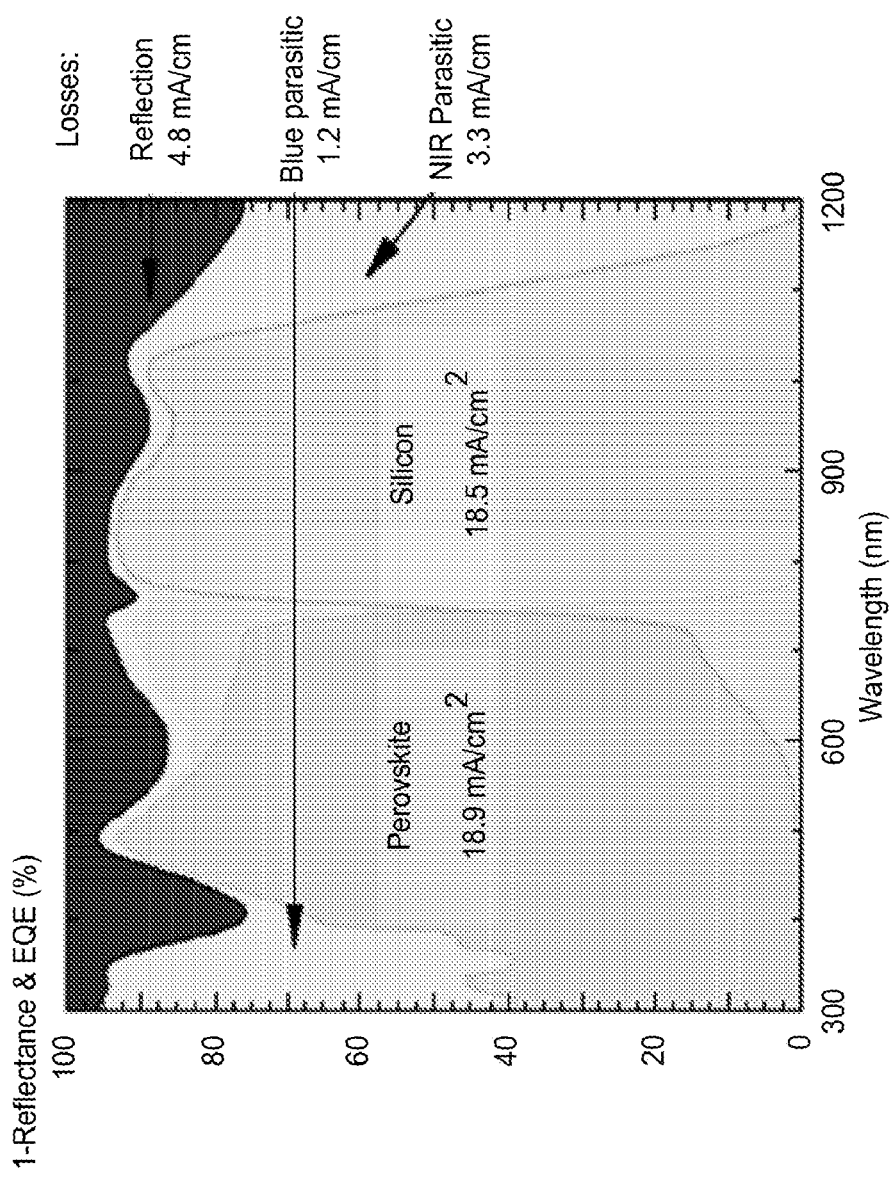

FIGS. 8A-B depict measured performance data for a tandem solar cell in accordance with the present invention. The data shown in plots 800 and 802 was measured using a solar cell structure analogous to that of solar cell 600 having an active area of 1 cm$^2$ and a fill factor of approximately 0.79.

Plot 800 depicts a measured 3-V scan that shows an open circuit voltage (Voc) of 1.66V and a high short-circuit current density of 18.6 mA/cm$^2$, resulting in an efficiency of 23.7%. In addition, the device maintained this efficiency while being held at its maximum power point for more than one hour under constant illumination. These results demonstrate that the ALD- and p-CVD-deposited buffer layers enable deposition of a window layer that prevents pinholes and shunt pathways.

Furthermore, the total absorption (1-reflectance) and external quantum efficiencies (EQE) for each sub-cell in the tandem solar-cell structure were determined as Top cell 100 generates a short circuit current density (JSC) of 18.9 mA/cm2. Silicon solar cell 602 starts responding from 640 nm as benefited from the semi-transparent perovskite top cell, and produces a JSC of 18.5 mA/cm$^2$, which is, however, lower than the top cell.

Plot 802 also includes results of a current-loss analysis that reveals that the surface reflection loss is 4.8 mA/cm$^2$. Parasitic absorption loss is indicated by the gap between 1-reflection and EQE curves, revealing total losses from parasitic absorption at 4.5 mA/cm$^2$. Total device 600 current density will be limited by the half cell (i.e. solar cell 100 or silicon solar cell 602) with the lower current density.

Contact 122 acts as a highly transparent and conductive electrode. In addition, ITO has good moisture barrier properties that significantly increase the thermal and environmental stability of a perovskite solar cell (e.g., solar cell 100) by substantially trapping volatile methylammonium cations. The combination of the increased thermal and moisture stability of the mixed formamidinium and cesium perovskite (as compared to the pure methylammonium perovskite and dense, pinhole free ALD SnO$_2$ layers in accordance with the present invention afford embodiments of the present invention with improved stability than for prior-art perovskite-based solar cells (either single junction or tandem configurations).

This improved stability has been shown by operating CsFA perovskite solar cells capped with ALD-deposited SnO$_2$ and ITO at their maximum power point in ambient atmosphere without additional encapsulation under one-sun equivalent visible illumination with a sulfur plasma lamp. In contrast to prior-art perovskite-based solar cells, the devices in accordance with the present invention operated for 1000 hours at or higher than the initial efficiency. In addition, it is known that small dust particles in perovskite material can give rise to pinholes in the ITO encapsulation, which leads to pathways for methylammonium evolution and the eventual degradation of power efficiency. CsFA-perovskite-based solar cells comprising ALD-deposited SnO$_2$, however, exhibited no pinholes after 600 hours of operation, thereby evincing the efficacy of the conformal ALD process to prevent pinhole formation and to the overall increased stability of the CsFA perovskite.

It is to be understood that the disclosure teaches just one example of the illustrative embodiment and that many variations of the invention can easily be devised by those skilled in the art after reading this disclosure and that the scope of the present invention is to be determined by the following claims.

What is claimed is:

1. A method for forming a perovskite-based solar cell operative for converting a first light signal (124) into electrical energy, the method including:

providing a first absorption layer (110) comprising a first perovskite (112), the first absorption layer being operative for absorbing at least a first portion (P1) of the first light signal;

forming a buffer layer (116) that is disposed on the first absorption layer, the buffer layer including a first layer (118) comprising a first metal oxide, wherein the first layer is formed at a temperature that is less than or equal to 150° C. using a process selected from the group consisting of atomic-layer deposition (ALE), chemical-vapor deposition (CVD) and pulsed-chemical-vapor deposition (p-CVD); and forming a first electrical contact (122) on the buffer layer, wherein the first electrical contact is substantially transparent for at least a portion of the first light signal.

2. The method of claim 1 wherein the first layer is formed such that it is substantially conformal with a first surface (S1) of the first absorption layer.

3. The method of claim 1 wherein the buffer layer is formed such that it includes a second layer (120) comprising a second metal oxide.

4. The method of claim 3 wherein the first metal oxide is selected from the group consisting of tin oxide, zinc oxide, and titanium oxide, and wherein the second metal oxide is zinc tin oxide (ZTO).

5. The method of claim 1 wherein the first perovskite includes cesium.

6. The method of claim 1 further comprising forming the first absorption layer such that it is disposed on a second absorption layer (604) that is operative for absorbing a at least a second portion (P2) of the first light signal.

7. The method of claim 1 wherein the first electrical contact is formed via a process selected from the group consisting of sputter deposition, evaporation, chemical-vapor deposition, physical-vapor deposition, and spin coating.

8. A method for forming a perovskite-based solar cell operative for converting a first light signal (124) into electrical energy, the method including:
- providing a first absorption layer (110) comprising a first perovskite (112), the first absorption layer being operative for absorbing at least a first portion (P1) of the first light signal;
- forming a buffer layer (116) that is disposed on the first absorption layer, the buffer layer consisting of metal oxide; and
- forming a first electrical contact (122) on the buffer layer, wherein the first electrical contact is substantially transparent for at least a portion of the first light signal.

9. The method of claim 8 wherein the buffer layer is formed such that it includes a first layer consisting of a first metal oxide and a second layer (120) consisting of a second metal oxide.

10. The method of claim 8 further comprising forming the first absorption layer such that it is disposed on a second absorption layer (604) that is operative for absorbing a at least a second portion (P2) of the first light signal.

11. The method of claim 8 wherein the buffer layer is formed at a temperature that is less than or equal to 150° C. using a process selected from the group consisting of atomic-layer deposition (ALE), chemical-vapor deposition (CVD) and pulsed-chemical-vapor deposition (p-CVD).

* * * * *